(12) United States Patent
Kim et al.

(10) Patent No.: US 11,435,664 B2
(45) Date of Patent: *Sep. 6, 2022

(54) PHOTOPOLYMER COMPOSITION

(71) Applicants: LG CHEM, LTD., Seoul (KR); KOREA ADVANCED INSTITUTE OF SCIENCE AND TECHNOLOGY, Daejeon (KR)

(72) Inventors: Heon Kim, Daejeon (KR); Yoosik Kim, Daejeon (KR); Raisa Kharbash, Daejeon (KR); Se Hyun Kwon, Daejeon (KR); Yeongrae Chang, Daejeon (KR); Seokhoon Jang, Daejeon (KR)

(73) Assignees: LG Chem, Ltd., Seoul (KR); Korea Advanced Institute of Science and Technology, Daejeon (KR)

( * ) Notice: Subject to any disclaimer, the term of this patent is extended or adjusted under 35 U.S.C. 154(b) by 15 days.

This patent is subject to a terminal disclaimer.

(21) Appl. No.: 16/968,084

(22) PCT Filed: Dec. 13, 2019

(86) PCT No.: PCT/KR2019/017732
§ 371 (c)(1),
(2) Date: Aug. 6, 2020

(87) PCT Pub. No.: WO2020/122678
PCT Pub. Date: Jun. 18, 2020

(65) Prior Publication Data
US 2021/0026239 A1 Jan. 28, 2021

(30) Foreign Application Priority Data

Dec. 14, 2018 (KR) .................. 10-2018-0162284
Dec. 11, 2019 (KR) .................. 10-2019-0165053

(51) Int. Cl.
*G03H 1/02* (2006.01)
*G03F 7/031* (2006.01)
*G03F 7/035* (2006.01)
*G03F 7/027* (2006.01)
*G03F 7/075* (2006.01)
*G03F 7/105* (2006.01)
*C08J 3/24* (2006.01)
*C08F 220/18* (2006.01)
*G03F 7/00* (2006.01)

(52) U.S. Cl.
CPC ........ *G03F 7/001* (2013.01); *C08F 220/1804* (2020.02); *C08J 3/24* (2013.01); *G03F 7/031* (2013.01); *G03F 7/0758* (2013.01); *G03F 7/105* (2013.01); *G03H 1/02* (2013.01); *C08J 2333/08* (2013.01); *G03H 2001/0264* (2013.01); *G03H 2260/12* (2013.01)

(58) Field of Classification Search
None
See application file for complete search history.

(56) References Cited

U.S. PATENT DOCUMENTS

| | | | |
|---|---|---|---|
| 8,889,321 B2 | 11/2014 | Bruder et al. | |
| 10,001,703 B2 | 6/2018 | Berneth et al. | |
| 11,079,678 B2 * | 8/2021 | Jang ................ | C08L 33/06 |
| 11,126,082 B2 * | 9/2021 | Jang ................ | G03H 1/02 |
| 11,226,557 B2 * | 1/2022 | Jang ................ | G03F 7/001 |
| 2003/0219603 A1 * | 11/2003 | Teng ................ | G03F 7/085 |
| | | | 428/414 |
| 2006/0057467 A1 | 3/2006 | Takizawa | |
| 2006/0194122 A1 * | 8/2006 | Takizawa ........... | G03F 7/001 |
| | | | 430/1 |
| 2007/0184353 A1 | 8/2007 | Satou et al. | |
| 2009/0274961 A1 | 11/2009 | Koseki et al. | |
| 2011/0236803 A1 | 9/2011 | Weiser et al. | |
| 2012/0231376 A1 * | 9/2012 | Rolle ................ | G03F 7/001 |
| | | | 430/2 |

(Continued)

FOREIGN PATENT DOCUMENTS

CN 108912308 * 11/2018
CN 108912308 A 11/2018

(Continued)

OTHER PUBLICATIONS

Ishi-i et al., "Fluorescent two-photon absorption benzothiadiazole dyes having photoreleasing quenchers", Chem Lett., vol. 38(11) pp. 1042-1043 (2009).*

(Continued)

*Primary Examiner* — Martin J Angebranndt
(74) *Attorney, Agent, or Firm* — Dentons US LLP

(57) ABSTRACT

Provided is a photopolymer composition for hologram recording comprising:
a polymer matrix or a precursor thereof;
a dye including a compound of the following Chemical Formula 1;
a photoreactive monomer; and
a photoinitiator,

[Chemical Formula 1]

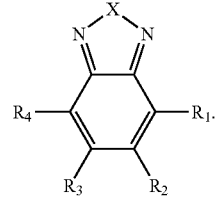

14 Claims, No Drawings

(56) References Cited

U.S. PATENT DOCUMENTS

| | | |
|---|---|---|
| 2013/0224634 A1 | 8/2013 | Berneth et al. |
| 2015/0118601 A1 | 4/2015 | Rolle et al. |
| 2016/0054704 A1 | 2/2016 | Berneth et al. |
| 2016/0108317 A1* | 4/2016 | Kirsch ............... C07D 285/14 |
| | | 136/252 |
| 2016/0240713 A1 | 8/2016 | Santarelli et al. |
| 2016/0320695 A1 | 11/2016 | Rolle et al. |
| 2019/0317404 A1* | 10/2019 | Jang ....................... G03F 7/001 |
| 2020/0150528 A1* | 5/2020 | Jang ....................... C08L 51/08 |
| 2020/0263038 A1* | 8/2020 | Kim ....................... G03F 7/033 |
| 2020/0354497 A1* | 11/2020 | Kim ................... C08G 18/8108 |
| 2020/0355996 A1* | 11/2020 | Kim ....................... G03F 7/033 |
| 2021/0003919 A1* | 1/2021 | Kim ....................... G03F 7/075 |
| 2021/0239894 A1* | 8/2021 | Jang ....................... C08L 33/10 |

FOREIGN PATENT DOCUMENTS

| | | | |
|---|---|---|---|
| EP | 1508833 A2 | | 2/2005 |
| EP | 2372454 A1 | | 10/2011 |
| JP | 2004-296529 | * | 10/2004 |
| JP | 2005-189256 A | | 7/2005 |
| JP | 2006-235386 A | | 9/2006 |
| JP | 4636469 B2 | | 2/2011 |
| JP | 2014-234495 A | | 12/2014 |
| JP | 2014-237792 A | | 12/2014 |
| KR | 10-2006-0110365 A | | 10/2006 |
| KR | 10-2012-0101643 A | | 9/2012 |
| KR | 10-2013-0126611 A | | 11/2013 |
| KR | 102014010482 | * | 8/2014 |
| KR | 10-2015-0006428 A | | 1/2015 |
| KR | 10-2016-0072158 A | | 6/2016 |
| KR | 10-2016-0102225 A | | 8/2016 |

OTHER PUBLICATIONS

Machine translation of CN 108912308 (Nov. 2018).*
Machine translation of KR 102014010482 (Aug. 2014).*
Machine transaltion of JP 2004-296529 (2004).*
Neto et al., "Reductive sulfur extrusion reaction of 2,1,3-benzothiadiazole compounds: a new methodology using NaBH4/CoCl2.6H2O(cat) as the reducing system," Tetrahedron Letters 46: 6843-6846 (2005).
Search Report of Euorpean Patent Office in Appl'n No. 19896625.1, dated Feb. 10, 2021.

* cited by examiner

PHOTOPOLYMER COMPOSITION

CROSS-REFERENCE TO RELATED APPLICATION(S)

This application is a National Stage Application of International Application No. PCT/KR2019/017732 filed on Dec. 13, 2019, which claims priority to Korean Patent Application No. 10-2018-0162284 filed on Dec. 14, 2018 and Korean Patent Application No. 10-2019-0165053 filed on Dec. 11, 2019 with the Korean Intellectual Property Office, the disclosures of which are incorporated herein by reference in their entirety.

TECHNICAL FIELD

The present disclosure relates to a photopolymer composition, a hologram recording medium, an optical element and a holographic recording method.

BACKGROUND ART

Hologram recording medium records information by changing a refractive index in the holographic recording layer in the medium through an exposure process, reads the variation of refractive index in the medium thus recorded, and reproduces the information.

When a photopolymer (photosensitive resin) is used, the light interference pattern can be easily stored as a hologram by photopolymerization of the low molecular weight monomer. Therefore, the photopolymer can be used in various fields such as optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

Typically, a photopolymer composition for hologram production comprises a polymer binder, a monomer, and a photoinitiator, and the photosensitive film produced from such a composition is irradiated with laser interference light to induce photopolymerization of local monomers.

During such photopolymerization process, in a portion where a relatively large number of monomers are present, the refractive index becomes high, and in a portion where a relatively large number of polymer binders are present, the refractive: relatively lowered and thus, the refractive index modulation occurs, and a diffraction grating is generated by such refractive index modulation. The refractive index modulation value n is influenced by the thickness and the diffraction efficiency (DE) of the photopolymer layer, and the angular selectivity is wider as the thickness decreases.

Recently, along with the demand for the development of materials capable of maintaining a hologram with high diffraction efficiency and stability, various attempts have been conducted to manufacture a photopolymer layer having a large refractive index modulation even while being thin.

DETAILED DESCRIPTION OF THE INVENTION

Technical Problem

It is one object of the present disclosure to provide a photopolymer composition which can more easily provide a photopolymer layer which can achieve a large refractive index modulation value even while being thin, has a relatively fast reaction rate and thus can shorten the recording time, and has improved durability against temperature and humidity.

It is another object of the present disclosure to provide a hologram recording medium that can achieve a large refractive index modulation value even while being thin, has a relatively fast reaction rate and thus can shorten the recording time, and has improved durability against temperature and humidity.

It is still another object of the present disclosure to provide an optical element comprising the above-mentioned hologram recording medium.

It is a further object of the present disclosure to provide a holographic recording method comprising selectively polymerizing photoreactive monomers contained in the photopolymer composition by a coherent laser.

Technical Solution

In one aspect, a photopolymer composition for hologram recording comprising a dye compound having a novel structure is provided herein.

In another aspect, a hologram recording medium produced from the above-mentioned photopolymer composition is provided herein In another aspect, an optical element comprising the above-mentioned hologram recording medium is provided herein.

In yet another aspect, a holographic recording method comprising selectively polymerizing photoreactive monomers contained in the above-mentioned photopolymer composition by a coherent laser is provided herein.

Hereinafter, a photopolymer composition, a hologram recording medium, an optical element, and a holographic recording method according to specific embodiments of the present disclosure will be described in more detail.

As used herein, the (meth)acrylate refers to either methacrylate or acrylate.

As used herein, the (co)polymer refers to either a homopolymer or a copolymer (including a random copolymer, a block copolymer, and a graft copolymer).

Further, the hologram as used herein refers to a recording medium in which optical information is recorded in an entire visible range and a near ultraviolet range (300 to 800 nm) through an exposure process, and examples thereof include all of visual holograms such as in-line (Gabor) holograms, off-axis holograms, full-aperture transfer holograms, white light transmission holograms ("rainbow holograms"), Denisyuk holograms, off-axis reflection holograms, edge-literature holograms or holographic stereograms.

As used herein, the alkyl group can be linear or branched, and the carbon number of thereof is not particularly limited, but is preferably 1 to 40. According to one embodiment, the carbon number of the alkyl group is 1 to 20. According to another embodiment, the carbon number of the alkyl group is 1 to 10. According to still another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methylbutyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 2-methylpentyl, 4-methylhexyl, 5-methylhexyl, and the like, but are not limited thereto.

As used herein, the alkylene group is a bivalent functional group derived from alkane, and can be, for example, linear, branched or cyclic methylene group, ethylene group, propylene group, isobutylene group, sec-butylene group, tert-butylene group, pentylene group, hexylene group, and the like.

According to one embodiment of the present disclosure, provided is a photopolymer composition comprising: a polymer matrix or a precursor thereof; a dye including a compound of the following Chemical Formula 1; a photoreactive monomer; and a photoinitiator:

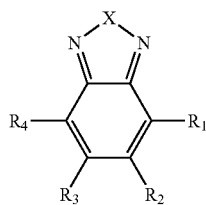

[Chemical Formula 1]

wherein in Chemical Formula 1:
X is oxygen or sulfur; and
$R_1$ to $R_4$ are each independently selected from the group consisting of:
hydrogen;
an alkyl group having 1 to 20 carbon atoms;
an alkoxy group having 1 to 20 carbon atoms;
a cycloalkyl group having 4 to 20 carbon atoms;
an aromatic hydrocarbon group having 6 to 20 carbon atoms;
an aromatic hydrocarbon group having 6 to 20 carbon atoms to which a cyanoacrylate or an ester group thereof is bonded;
an amine group;
a halogen;
an alicyclic or aromatic heterocycle having 4 to 20 carbon atoms containing at least one of oxygen, sulfur or nitrogen;
a cycloalkyl group having 4 to 20 carbon atoms substituted with at least one alicyclic or aromatic heterocycle having 4 to 20 carbon atoms containing at least one of oxygen, sulfur or nitrogen; and
an aromatic hydrocarbon group having 6 to 20 carbon atoms substituted with at least one alicyclic or aromatic heterocycle having 4 to 20 carbon atoms containing at least one of oxygen, sulfur or nitrogen.

The present inventors have newly synthesized the compound of Chemical Formula 1 above, and found through experiments that as the compound of Chemical Formula 1 has the above-mentioned novel structure, it can have high photosensitizer properties, excellent light resistance and high solubility in solvents, can achieve improved luminance and color reproduction, and can achieve high refractive index modulation in holographic media; in particular, the compound of Chemical Formula 1 has a relatively fast reaction rate when applied to a holographic medium and thus can shorten the recording time, as compared with previously known dyes, thereby completing the present disclosure.

More specifically, the compound of Chemical Formula 1 can be used as a dye n a photopolymer composition that provides a holographic recording medium.

In Chemical Formula 1, definitions of each functional group are the same as those described above.

More specific examples of the compound of Chemical Formula 1 are as follows.

In Chemical Formula 1:
X is oxygen or sulfur; and
at least one of $R_1$ to $R_4$ is selected from the group consisting of:
an alicyclic or aromatic heterocycle having 4 to 20 carbon atoms containing at least one of oxygen, sulfur or nitrogen;
a cycloalkyl group having 4 to 20 carbon atoms substituted with at least one alicyclic or aromatic heterocycle having 4 to 20 carbon atoms containing at least one of oxygen, sulfur or nitrogen; and
an aromatic hydrocarbon group having 6 to 20 carbon atoms substituted with at least one alicyclic or aromatic heterocycle having 4 to 20 carbon atoms containing at least one of oxygen, sulfur or nitrogen.

Also, in Chemical Formula 1:
X is oxygen or sulfur;
$R_2$ and $R_3$ are each independently hydrogen, an alkyl group having 1 to 20 carbon atoms, or a halogen; and
one of $R_1$ and $R_4$ is an amine group, and the other is selected from the group consisting of:
an alicyclic or aromatic heterocycle having 4 to 20 carbon atoms containing at least one of oxygen, sulfur or nitrogen;
a cycloalkyl group having 4 to 20 carbon atoms substituted with an alicyclic or aromatic heterocycle having 4 to 20 carbon atoms containing at least one of oxygen, sulfur or nitrogen; and
an aromatic hydrocarbon group having 6 to 20 carbon atoms substituted with an alicyclic or aromatic heterocycle having 4 to 20 carbon atoms containing at least one of oxygen, sulfur or nitrogen.

Further, in Chemical Formula 1:
X is oxygen or sulfur;
$R_2$ and $R_3$ are each independently an alkoxy group having 1 to 5 carbon atoms; and
$R_1$ and $R_4$ are each independently selected from the group consisting of:
an alicyclic or aromatic heterocycle having 4 to 20 carbon atoms containing at least one of oxygen, sulfur or nitrogen;
a cycloalkyl group having 4 to 20 carbon atoms substituted with an alicyclic or aromatic heterocycle having 4 to 20 carbon atoms containing one or more of oxygen, sulfur or nitrogen; and
an aromatic hydrocarbon group having 6 to 20 carbon atoms substituted with an alicyclic or aromatic heterocycle having 4 to 20 carbon atoms containing one or more of oxygen, sulfur or nitrogen.

Further, in Chemical Formula 1:
X is oxygen or sulfur;
$R_2$ and $R_3$ are each independently an alkoxy group having 1 to 5 carbon atoms; and
$R_1$ and $R_4$ can be each independently an aromatic hydrocarbon group having 6 to 20 carbon atoms to which a cyanoacrylate or an ester group thereof is bonded.

The cyanoacrylate ester group can be one in which hydrogen of the carboxyl group (—COOH) of the cyanoacrylate is replaced by an aliphatic functional group having 1 to 20 carbon atoms, an alicyclic functional group having 3 to 20 carbon atoms, an alicyclic functional group having 3 to 20 carbon atoms substituted with one or more aliphatic functional groups having 1 to 20 carbon atoms, an aromatic functional group having 6 to 20 carbon atoms, or an aromatic functional group having 6 to 20 carbon atoms substituted with one or more aliphatic functional groups having 1 to 20 carbon atoms.

Further, more specific examples of the compound of Chemical Formula 1 include compounds of the following Chemical Formulas 2 to 5 or mixtures thereof:

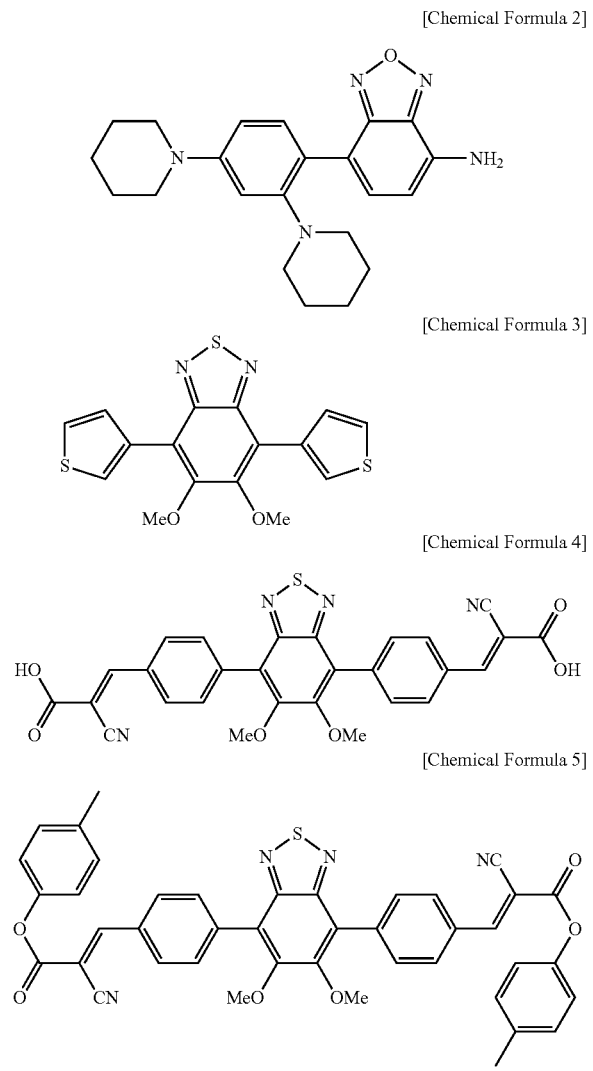

[Chemical Formula 2]

[Chemical Formula 3]

[Chemical Formula 4]

[Chemical Formula 5]

Generally, in photopolymer compositions that provide a hologram recording medium, methods such as imparting a certain change to a polymer matrix or a recording monomer used for increasing the refractive index modulation value and the diffraction efficiency, or using a specific additive thereto, etc. are known. However, the compound of Chemical Formula 1 described above can more easily improve the refractive index modulation value and the diffraction efficiency even if the amount of use is not so high, and when applied to a holographic medium, it has a relatively fast reaction rate and thus can shorten the recording time.

Meanwhile, the polymer matrix or a precursor thereof can serve as a support for the holographic recording medium and the final product produced therefrom, and the photoreactive monomer can serve as a recording monomer. In accordance with the use thereof, the photoreactive monomer can be selectively polymerized on the polymer matrix during holographic recording, thus exhibiting refractive index modulation due to portions having different refractive indices.

The polymer matrix or a precursor thereof can be used without particular limitation as long as it is a compound that can be commonly used in a photopolymer composition providing a holographic recording medium.

Specific examples of the polymer matrix or a precursor thereof include 1.) a reaction product between a compound containing one or more isocyanate groups and a polyol; or 2) a polymer matrix including a (meth)acrylate-based (co)polymer in which the silane-based functional group is located in a branched chain and a silane crosslinking agent.

A hologram formed from a photopolymer composition comprising a polymer matrix including a (meth)acrylate-based (co)polymer in which the silane-based functional group is located in a branched chain and a silane crosslinking agent, or a precursor thereof can achieve significantly improved refractive index modulation values and excellent durability against temperature and humidity even in a smaller thickness range, as compared with previously known holograms.

As the silane-based crosslinking agent and the polymer matrix containing a (meth)acrylate-based (co)polymer in which the silane-based functional group is located in a branched chain, or a precursor thereof are used, the crosslinking density is optimized when producing a coating film or a hologram from the photopolymer composition, and excellent durability against temperature and humidity can be secured as compared with the existing matrix. In addition, by optimizing the crosslinking density as described above, the mobility between the photoreactive monomer having a high refractive index and the component having a low refractive index can be increased, thereby maximizing the refractive index modulation and improving the recording characteristics.

In particular, a crosslinked structure mediated by a siloxane bond can be easily introduced through a sol-gel reaction between a modified (meth)acrylate-based (co)polymer containing a silane-based functional group and a silane crosslinking agent containing a terminal silane-based functional group, and excellent durability against temperature and humidity can be secured through this siloxane bond.

In the polymer matrix, the (meth)acrylate-based (co)polymer in which the silane-based functional group is located in a branched chain and the silane crosslinking agent can be present as separate components, and they can also be presented in the form of complexes formed by reaction with each other.

In the above (meth)acrylate-based (co)polymer, the silane-based functional group can be located in a branched chain. The silane-based functional group can include a silane functional group or an alkoxysilane functional group, and preferably, a trimethoxysilane group can be used as an alkoxysilane functional group.

The silane-based functional group can form a siloxane bond through a sol-gel reaction with the silane-based functional group contained in the silane crosslinking agent to crosslink the (meth)acrylate-based (co)polymer and the silane crosslinking agent.

The silane crosslinking agent can be a compound having an average of one or more silane-based functional groups per molecule or a mixture thereof, or it can be a compound containing one or more silane-based functional groups. The silane-based functional group can include a silane functional group or an alkoxysilane functional group, and preferably, a triethoxysilane group can be used as the alkoxysilane functional group. The silane-based functional group forms a siloxane bond through a sol-gel reaction with the silane-based functional group contained in the (meth)acrylate-based (co)polymer to crosslink the (meth)acrylate-based (co)polymer and the silane crosslinking agent.

At this time, the silane crosslinking agent can have an equivalent weight of the silane-based functional groups of 200 g/equivalent to 1000 g/equivalent. Thereby, the crosslinking density between the (meth)acrylate-based (co)polymer and the silane crosslinking agent is optimized, and thus, excellent durability against temperature and humidity can be secured as compared with the existing matrix. In addition, by optimizing the crosslinking density as described above, the mobility between the photoreactive monomer having a high refractive index and the component having a low refractive index is increased, and thereby, the refractive index modulation can be maximized and the recording characteristics can be improved.

If the equivalent weight of the silane-based functional group contained in the silane crosslinking agent is excessively increased to 1000 g/equivalent or more, the interface of the diffraction grating after recording can be collapsed due to the reduction in the crosslinking density of the matrix. Due to the loose crosslinking density and the low glass transition temperature, the monomer and plasticizer components can be eluted to the surface to generate haze. When the equivalent weight of the silane-based functional group contained in the silane crosslinking agent is excessively reduced to less than 200 g/equivalent, the crosslinking density is too high, which impedes the mobility of the monomer and plasticizer components, and thereby, the problem that the recording characteristics become extremely low can occur.

More specifically, the silane crosslinking agent is a linear polyether main chain having a weight average molecular weight of 100 to 2000, or 300 to 1000, or 300 to 700, and a silane-based functional group bonded to a terminal or branched chain of the main chain.

The linear polyether main chain having a weight average molecular weight of 100 to 2000 can include the repeating unit of the following Chemical Formula 13:

     [Chemical Formula 13]

wherein in Chemical Formula 13, $R_8$ is an alkylene group having 1 to 10 carbon atoms, and n is an integer of 1 or more, or 1 to 50, or 5 to 20, or 8 to 10.

As the silane crosslinking agent introduces a flexible polyether polyol as a main chain, the mobility of the components can be improved through adjustments of the glass transition temperature and the crosslinking density of the matrix.

Meanwhile, the bond between the silane-based functional group and the polyether main chain can be formed via a urethane bond. Specifically, the silane-based functional group and the polyether main chain can form a mutual bond through a urethane bond. More specifically, the silicon atom contained in the silane-based functional group is bonded directly to the nitrogen atom of the urethane bond or via an alkylene group having 1 to 10 carbon atoms, and the functional group of $R_8$ contained in the polyether main chain can be bonded directly to an oxygen atom of the urethane bond.

The reason why the silane-based functional group and the polyether main chain are bonded via a urethane bond in this way is that the silane crosslinking agent is a reaction product produced through reaction between an isocyanate compound containing a silane-based functional group and a linear polyether polyol compound having a weight average molecular weight of 100 to 2000.

More specifically, the isocyanate compound can include an aliphatic, cycloaliphatic, aromatic or aromatic aliphatic mono-isocyanate di-isocyanate, tri-isocyanate or poly-isocyanate; or an oligo-isocyanate or a poly-isocyanate of di- or tri-isocyanate having urethane, urea, carbodiimide, acyl urea, isocyanurate, allophanate, buret, oxadiazinetrione, uretdione or iminooxadiazine dione structures.

Specific examples of the isocyanate compound containing the silane-based functional group can be 3-isocyanatopropyltriethoxysilane.

Further, the polyether polyols are, for example, the polyaddition products of styrene oxides, ethylene oxide, propylene oxide, tetrahydrofuran, butylene oxide, epichlorohydrin and their mixed adducts and graft products, and the polyether polyols obtained by condensation of polyhydric alcohols or mixtures thereof and those obtained by alkoxylation of polyhydric alcohols, amines and amino alcohols.

Specific examples of the polyether polyols are poly(propylene oxides), poly(ethylene oxides) and combinations thereof in the form of random or block copolymers, or poly(tetrahydrofurans) and mixtures thereof, having an OH functionality of 1.5 to 6 and a number average molecular weight between 200 and 18000 g/mol, preferably having an OH functionality of 1.8 to 4.0 and a number average molecular weight of 600 to 8000 g/mol and particularly preferably having an OH functionality of 1.9 to 3.1 and a number average molecular weight of 650 to 4500 g/mol.

When the silane-based functional group and the polyether main chain are bonded via a urethane bond in this way, a silane crosslinking agent can be more easily synthesized.

The weight average molecular weight (measured by GPC) of the silane crosslinking agent can be 1000 to 5,000,000. The weight average molecular weight refers to a weight average molecular weight (unit: g/mol) converted in terms of polystyrene measured by GPC method. In the process of measuring the weight average molecular weight in terms of polystyrene measured by GPC method, a detector and an analytical column, such as a commonly known analysis apparatus and differential refractive index detector can be used, and commonly applied temperature conditions, solvent, and flow rate can be used. Specific examples of the measurement conditions can include a temperature of 30° C., chloroform solvent and a flow rate of 1 mL/min.

Meanwhile, the (meth)acrylate-based (co)polymer can include a (meth)acrylate repeating unit and a (meth)acrylate repeating unit in which a silane-based functional group is located in a branched chain.

Examples of the (meth)acrylate repeating unit in which a silane-based functional group is located in a branched chain can include a repeating unit of the following Chemical Formula 11:

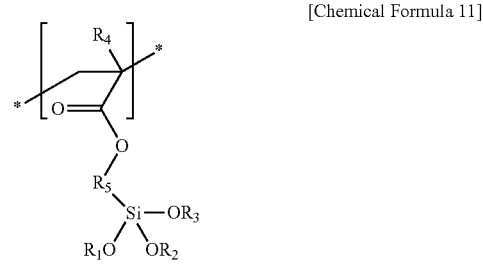
[Chemical Formula 11]

wherein in Chemical Formula 11, $R_1$ to $R_3$ are each independently an alkyl group having 1 to 10 carbon atoms, $R_4$ is hydrogen or an alkyl group having 1 to 10 carbon atoms, and $R_5$ is an alkylene group having 1 to 10 carbon atoms.

Preferably, in Chemical Formula 11, $R_1$ to $R_3$ are each independently a methyl group having 1 carbon atom, $R_4$ is a methyl group having 1 carbon atom, $R_5$ is a repeating unit derived from 3-methacryloxypropyltrimethoxysilane (KBM-503) which is a propylene group having 3 carbon atoms, or $R_1$ to $R_3$ are each independently a methyl group having 1 carbon atom, $R_4$ is hydrogen, and $R_5$ can be a repeating unit derived from 3-acryloxypropyltrimethoxysilane (KBM-5103) which is a propylene group having 3 carbon atoms.

Further, examples of the (meth)acrylate repeating unit can be a repeating unit of the following Chemical Formula 12:

[Chemical Formula 12]

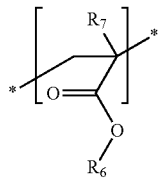

wherein in Chemical Formula 12, $R_6$ is an alkyl group having 1 to 20 carbon atoms, and $R_7$ is hydrogen or an alkyl group having 1 to 10 carbon atoms. Preferably, Chemical Formula 12, can be a repeating unit derived from butyl acrylate where $R_6$ is a butyl group having 4 carbon atoms, and $R_7$ is hydrogen.

The molar ratio between the repeating unit of Chemical Formula 12 and the repeating unit of Chemical Formula 11 can be 0.5:1 to 14:1. If the molar ratio of repeating units of Chemical Formula 11 is excessively reduced, the crosslinking density of the matrix becomes too low to serve as a support, which can cause in a decrease in recording characteristics after recording. And, if the molar ratio of the repeating units of Chemical Formula 11 is excessively increased, the crosslinking density of the matrix becomes too high, and the mobility of the respective components is deteriorated which can cause a decrease in the refractive index modulation value.

The weight average molecular weight (measured by GPC) of the (meth)acrylate-based (co)polymer can be 100,000 to 5,000,000, or 300,000 to 900,000. The weight average molecular weight refers to a weight average molecular weight (unit: g/mol) converted in terms of polystyrene measured by GPC method. In the process of measuring the weight average molecular weight converted in terms of polystyrene measured by GPC method, a detector and an analytical column, such as a commonly known analysis apparatus and differential refractive index detector can be used, and commonly applied temperature conditions, solvent, and flow rate can be used. Specific examples of the measurement conditions can include a temperature of 30° C., chloroform solvent and a flow rate of 1 mL/min.

Meanwhile, in the (meth)acrylate-based (co)polymer, the equivalent weight of the silane-based functional group can be 300 g/equivalent to 2000 g/equivalent, or 500 g/equivalent to 2000 g/equivalent, or 550 g/equivalent to 1800 g/equivalent, or 580 g/equivalent to 1600 g/equivalent, or 586 g/equivalent to 1562 g/equivalent.

The silane-based functional group equivalent weight is an equivalent weight of one silane-based functional group (g/equivalent), which is a value obtained by dividing the weight average molecular weight of the (meth)acrylate-based (co)polymer by the number of silane-based functional groups per molecule. The smaller the equivalent weight value, the higher the density of the functional group, and the larger the equivalent weight value, the smaller the density of the functional group.

Consequently, the crosslinking density between the (meth)acrylate (co)polymer and the silane crosslinker can be optimized, thus securing excellent durability against temperature and humidity as compared with the existing matrix. In addition, by optimizing the crosslinking density as described above, the mobility between the photoreactive monomer having a high refractive index and the component having a low refractive index is increased, and thereby the refractive index modulation can be maximized and the recording characteristics can be improved.

When the equivalent weight of the silane-based functional group contained in the (meth)acrylate-based (co)polymer in which the silane-based functional group is located in a branched chain is excessively reduced to less than 300 g/equivalent, the crosslinking density of the matrix becomes too high and the mobility of the components is inhibited, which causes a reduction of the recording characteristics.

Further, if the equivalent weight of the silane-based functional group contained in the (meth)acrylate-based (co) polymer in which the silane-based functional group is located in a branched chain is excessively increased to more than 2000 g/equivalent, the crosslinking density is too low to serve as a support, the interface of the diffraction grating generated after recording is collapsed, and the refractive index modulation value can be decreased with the lapse of time.

Meanwhile, the silane crosslinking agent can be contained in an amount of 10 to 90 parts by weight, or 20 to 70 parts by weight, or 22 to 65 parts by weight based on 100 parts by weight of the (meth)acrylate-based (co)polymer.

In the reaction product, when the content of the silane crosslinking agent is excessively reduced relative to 100 parts by weight of the (meth)acrylate-based (co)polymer, the curing speed of the matrix is significantly slowed, the function as a support is lost, the interface of the diffraction grating after recording can be easily collapsed. In the reaction product, when the content of the silane crosslinking agent is excessively increased relative to 100 parts by weight of the (meth)acrylate-based (co)polymer, the curing speed of the matrix can be increased, but compatibility problems with other components occur due to an excessive increase in the reactive silane group content, and thus, haze occurs.

Further, the modulus (storage elastic modulus) of the reaction product can be 0.01 MPa to 5 MPa. As a specific example of the modulus measurement method, the value of storage modulus (G') can be measured at a room temperature (20° C. to 25° C.) at a frequency of 1 Hz using a discovery hybrid rheometer (DHR) from TA Instruments.

Further, the glass transition temperature of the reaction product can be −40° C. to 10° C. A specific example of the measurement method of the glass transition temperature can be a method of measuring the phase angle (loss modulus) change of the film coated with the photopolymerizable composition in the range of −80° C. to 30° C. under the setting conditions of strain of 0.1%, frequency of 1 Hz, temperature raising rate of 5° C./min using a dynamic mechanical analysis (DMA).

Another example of the polymer matrix or its precursor can be a polymer matrix including the reaction product between a compound containing at least one isocyanate group and a polyol.

The compound containing at least one isocyanate group can be a known compound having an average of one or more NCO functional groups per molecule or a mixture thereof, and can be a compound containing the one or more isocyanate groups.

More specifically, the compound containing one or more isocyanate groups is an aliphatic, cycloaliphatic, aromatic or aromatic aliphatic mono-isocyanate di-isocyanate, tri-isocyanate or poly-isocyanate. In addition, the compound containing one or more isocyanate groups can be relatively high molecular weight secondary products (oligo- and polyisocyanates) of monomeric di- and/or triisocyanates having urethane, urea, carbodiimide, acylurea, isocyanurate, allophanate, biuret, oxadiazinetrione, uretdione or iminooxadiazinedione structures.

Specific examples of the compound containing one or more isocyanate groups include butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanate, 1,4-phenylene diisocyanate, 2,4- and/or 2,6-toluene diisocyanate, 1,5-naphthylene diisocyanate, 2,4'- or 4,4'-diphenylmethane diisocyanate and/or 4,4',4''-triisocyanate and the like.

The polyol that forms a polymer matrix by reacting with the compound containing at least one isocyanate group can be an aliphatic, araliphatic or cycloaliphatic diol, triol and/or higher polyol, having 2 to 20 carbon atoms.

The polyol can have a hydroxyl equivalent weight of 300 g/mol to 10,000 g/mol and a weight average molecular weight of 100,000 to 1,500,0000 g/mol.

Examples of the diols are ethylene glycol, diethylene glycol, triethylene glycol, tetraethylene glycol, dipropylene glycol, tripropylene glycol, 1,2-propanediol, 1,3-propanediol, 1,4-butanediol, neopentylglycol, 2-ethyl-2-butylpropanediol, trimethylpentanediol, diethyloctanediol positional isomers, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), and 2,2-dimethyl-3-hydroxypropyl dimethyl-3-hydroxypropionate.

Further, examples of the triols are trimethylolethane, trimethylolpropane or glycerol. Suitable higher-functional alcohols are ditrimethylolpropane, pentaerythritol, dipentaerythritol or sorbitol.

Further, as the polyol, relatively high molecular weight aliphatic and cycloaliphatic polyols, such as polyester polyols, polyether polyols, polycarbonate polyols, hydroxyfunctional acrylic resins, hydroxy-functional polyurethanes, hydroxy-functional epoxy resins or the like can be used.

The polyesterpolyols are linear polyester diols, as can be prepared in a known manner from aliphatic, cycloaliphatic or aromatic di- or polycarboxylic acids or their anhydrides, such as, for example, succinic acid, glutaric acid, adipic acid, pimelic acid, suberic acid, azelaic acid, sebacic acid, nonanedicarboxylic acid, decanedicarboxylic acid, terephthalic acid, isophthalic acid, o-phthalic acid, tetrahydrophthalic acid, hexahydrophtalic acid or trimellitic acid, and acid anhydrides, such as o-phthalic anhydride, trimellitic anhydride or succinic anhydride, or a mixture thereof, by using polyhydric alcohols, such as, for example, ethanediol, di-, tri- or tetraethylene glycol, 1,2-propanediol, di-, tri-, or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol or mixtures thereof, optionally with concomitant use of higher functional polyols, such as trimethylolpropane or glycerol. Of course, cycloaliphatic and/or aromatic di- and polyhydroxy compounds are also suitable as polyhydric alcohols for the preparation of the polyester polyols. Instead of the free polycarboxylic acid, it is also possible to use the corresponding polycarboxylic anhydrides or corresponding polycarboxylates of lower alcohols or mixtures thereof for the preparation of the polyesters.

Further, polyester polyols which can be used for the synthesis of the polymer matrix can be homo- or copolymers of lactones, which are preferably obtained by an addition reaction of lactones or lactone mixtures, such as butyrolactone, ε-caprolactone and/or methyl-ε-caprolactone, with suitable difunctional and/or higher-functional initiator molecules, such as, for example, the low molecular weight polyhydric alcohols mentioned above as synthesis components for polyester polyols.

Further, polycarbonates having hydroxyl groups are also suitable as a polyhydroxy component for the prepolymer synthesis, for example those which can be prepared by reaction of diols, such as 1,4-butanediol and/or 1,6-hexanediol and/or 3-methylpentanediol, with diaryl carbonates, e.g., diphenyl carbonate, dimethyl carbonate or phosgene.

Further, polyether polyols that can be used for the synthesis of the polymer matrix include, for example, the polyaddition products of styrene oxides, of ethylene oxide, propylene oxide, tetrahydrofuran, butylene oxide, epichlorohydrin and their mixed adducts and graft products, and the polyether polyols obtained by condensation of polyhydric alcohols or mixtures thereof and those obtained by alkoxylation of polyhydric alcohols, amines and amino alcohols. Specific examples of the polyether polyols are poly(propylene oxides), poly(ethylene oxides) and combinations thereof in the form of random or block copolymers or poly(tetrahydrofurans) and mixtures thereof having an OH functionality of 1.5 to 6 and a number average molecular weight between 200 and 18000 g/mol, preferably having an OH functionality of 1.8 to 4.0 and a number average molecular weight of 600 to 8000 g/mol and particularly preferably having an OH functionality of 1.9 to 3.1 and a number average molecular weight of 650 to 4500 g/mol.

Meanwhile, the photoreactive monomer can include a polyfunctional (meth)acrylate monomer or a monofunctional (meth)acrylate monomer.

As described above, in a portion where the monomer is polymerized in the process of photopolymerization of the photopolymer composition and the polymer is present in relatively large amounts, the refractive index becomes high. In a portion where the polymer binder is present in relatively large amounts, the refractive index becomes relatively low, the refractive index modulation occurs, and a diffraction grating is generated by such refractive index modulation.

Specifically, one example of the photoreactive monomer can include (meth)acrylate-based α,β-unsaturated carboxylic aid derivative, for example. (meth)acrylate, (meth)acrylamide, (meth)acrylonitrile, (meth)acrylic acid or the like, or a compound containing a vinyl group or a thiol group.

One example of the photoreactive monomer can include a polyfunctional (meth)acrylate monomer having a refractive index of 1.5 or more, 1.53 or more, or 1.5 to 1.7. The polyfunctional (meth)acrylate monomer having a refractive index of 1.5 or more, or 1.53 or more, or 1.5 to 1.7 can include a halogen atom (bromine, iodine, etc.), sulfur (S), phosphorus (P), or aromatic ring.

More specific examples of the photoreactive monomer include a polyfunctional (meth)acrylate monomer having a refractive index of 1.5 or more include bisphenol A modified diacrylate type, fluorene acrylate type (HR6022, etc. —Miwon Specialty Chemical), bisphenol fluorene epoxy acrylate type (HR6100, HR6060, HR6042, etc.—Miwon), halogenated epoxy acrylate series (HR1139, HR3362, etc.—Miwon).

Another example of the photoreactive monomer can include a monofunctional (meth)acrylate monomer. The monofunctional (meth)acrylate monomer can contain an ether bond and a fluorene functional group in the molecule. Specific examples of such monofunctional (meth)acrylate monomer include phenoxybenzyl (meth)acrylate, o-phenylphenol ethylene oxide (meth)acrylate, benzyl (meth)acrylate, 2-(phenylthio)ethyl (meth)acrylate, biphenylmethyl (meth)acrylate, or the like.

Meanwhile, the photoreactive monomer can have a weight average molecular weight of 50 g/mol to 1000 g/mol, or 200 g/mol to 600 g/mol. The weight average molecular weight refers to a weight average molecular weight converted in terms of polystyrene measured by GPC method.

Meanwhile, the photopolymer composition of the embodiment can include a photoinitiator. The photoinitiator is a compound which is activated by light or actinic radiation and initiates polymerization of a compound containing a photoreactive functional group such as the photoreactive monomer.

As the photoinitiator, commonly known photoinitiators can be used without particular limitation, but specific examples thereof include a photoradical polymerization initiator, a photocationic polymerization initiator, or a photoanionic polymerization initiator.

Specific examples of the photoradical polymerization initiator include imidazole derivatives, bisimidazole derivatives, N-aryl glycine derivatives, organic azide compounds, titanocene, aluminate complex, organic peroxide, N-alkoxypyridinium salts, thioxanthone derivatives, amine derivatives or the like. More specifically, examples of the photoradical polymerization initiator include 3-di(t-butyldioxycarbonyl)benzophenone, 3,3',4,4"-tetrakis(t-butyldioxycarbonyl)benzophenone, 3-phenyl-5-isoxazolone, 2-mercapto benzimidazole, bis(2,4,5-triphenyl)imidazole, 2,2-dimethoxy-1,2-diphenylethane-1-one (product name: Irgacure 651/manufacturer: BASF), 1-hydroxy-cyclohexyl-phenyl-ketone (product name: Irgacure 184/manufacturer: BASF), 2-benzyl-2-dimethylamino-1-(4-morpholinophenyl)-butanone-1 (product name: Irgacure 369/manufacturer: BASF), and bis($\eta$5-2,4-cyclopentadiene-1-yl)-bis(2,6-difluoro-3-(1H-pyrrole-1-yl)-phenyl)titanium (product name: Irgacure 784/manufacturer: BASF), Ebecryl P-115 (manufacturer: SK entis).

The photocationic polymerization initiator can include a diazonium salt, a sulfonium salt, or an iodonium salt, and examples thereof include sulfonic acid esters, imidosulfonates, dialkyl-4-hydroxysulfonium salts, arylsulfonic acid-p-nitrobenzyl esters, silanol-aluminum complexes, ($\eta$6-benzene) ($\eta$5-cyclopentadienylnron (II), or the like. In addition, benzoin tosylate, 2,5-dinitrobenzyltosylate, N-tosylphthalic acid imide, or the like can be mentioned. More specific examples of the photocationic polymerization initiator include commercially available products such as Cyracure UVI-6970, Cyracure UVI-6974 and Cyracure UVI-6990 (manufacturer: Dow Chemical Co. in USA), Irgacure 264 and Irgacure 250 (manufacturer: BASF) or CIT-1682 (manufacturer: Nippon Soda).

The photoanionic polymerization initiator can be borate salt, for example, butyryl chlorine butyl triphenyl borate, or the like. More specific examples of the photoanionic polymerization initiator include commercially available products such as Borate V (manufacturer: Spectra Group).

In addition, the photopolymer composition of the embodiment can include monomolecular (type I) initiator or bimolecular (type II) initiator. The (type I) system for free radical photopolymerization can include, for example, an aromatic ketone compounds in combination with a tertiary amine, such as benzophenone, alkylbenzophenone, 4,4'-bis(dimethylamino)benzophenone (Michler's ketone), anthrone and halogenated benzophenone or a mixture of these types. The bimolecular (type II) initiator can include benzoin and derivatives thereof, benzyl ketal, acylphosphine oxide, for example, 2,4,6-trimethylbenzoyldiphenylphosphine oxide, bisacylophosphine oxide, phenylglyoxyl ester, camphorquinone, alpha-aminoalkylphenone, alpha-dialkoxyacetophenone, 1-[4-(phenylthio)phenyl]octane-1,2-dione 2-(O-benzoyloxime), alpha-hydroxyalkylphenone, and the like.

The photopolymer composition of the embodiment can include 1% to 80% by weight of the polymer matrix or a precursor thereof; 1% to 80% by weight of the photoreactive monomer; 0.0001% to 10% by weight of the dye; and 0.1% to 20% by weight of the photoinitiator. When the photopolymer composition further includes an organic solvent as described hereinafter, the content of the above-mentioned components is based on the sum of the above-mentioned components (the sum of the components excluding the organic solvent).

Meanwhile, the photopolymer composition can further include at least one additive selected from the group consisting of a catalyst, a phosphate-based compound, and a low refractive index fluorine-based compound.

The phosphate-based compound and the low refractive index fluorine-based compound have a lower refractive index than the photoreactive monomer, and thus, the refractive index of the polymer matrix is lowered and the refractive index modulation of the photopolymer composition can be maximized. Furthermore, the phosphate-based compound can act as a plasticizer to lower the glass transition temperature of the polymer matrix, to increase the mobility of the photoreactive monomer and the low refractive components, and to contribute to the improvement of the formability of the photopolymer composition.

More specifically, the low refractive index fluorine-based compound has stability with little reactivity and has low refractive properties. Thus, when added to the photopolymer composition, the refractive index of the polymer matrix can be lowered, and the refractive index modulation with the monomer can be maximized.

Meanwhile, when the compound of Formula 1 and the low refractive-index fluorine-based compound are used together, Tg of the matrix is lowered by the low refractive-index fluorine-based compound serving as a plasticizer, and the reduction reaction rate of the compound dye of Chemical Formula 1 in the flexible matrix is accelerated, or the hydrogen transfer speed as an initiator (H-Transfer) is accelerated, whereby the monomer polymerization rate due to radical generation is improved, and the effect of shortening the recording time or increasing the recording efficiency can be achieved.

The fluorine-based compound can include at least two difluoromethylene groups and at least one functional group selected from the group consisting of an ether group, an ester group and an amide group. The fluorine-based compound can include a structure of the following Chemical Formula 14 in which functional groups including ether groups are bonded to both terminal ends of the central functional group including a direct bond or an ether bond between two difluoromethylene groups:

[Chemical Formula 14]

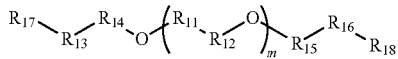

wherein in Chemical Formula 14, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently a polyalkylene oxide group, m is an integer of 1 or more, or an integer of 1 to 10, or an integer of 1 to 3.

Preferably, in Chemical Formula 14, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently a 2-methoxyethoxymethoxy group, and m is 2.

The fluorine-based compound can have a refractive index of less than 1.45, or more than 1.3 and less than 1.45. As described above, since the photoreactive monomer has a refractive index of 1.5 or more, the fluorine-based compound can reduce the refractive index of the polymer matrix through a lower refractive index compared to the photoreactive monomer, thereby maximizing the refractive index modulation with the monomer.

Specifically, the content of the fluorine-based compound can be 30 parts by weight to 150 parts by weight, or 50 parts by weight to 110 parts by weight, based on 100 parts by weight of the photoreactive monomer.

When the content of the fluorine-based compound is excessively reduced relative to 100 parts by weight of the photoreactive monomer, the refractive index modulation value after recording is lowered due to the lack of low refractive index components. When the content of the fluorine-based compound is excessively increased relative to 100 parts by weight of the photoreactive monomer, a haze can be generated due to the compatibility problem with other components, or it can cause a problem that some fluorine-based compounds are eluted on the surface of the coating layer.

The fluorine-based compound can have a weight average molecular weight (measured by GPC) of 300 or more, or 300 to 1000. A specific method of measuring the weight average molecular weight is as described above.

Meanwhile, specific examples of the phosphate-based compound include triphenyl phosphate, tricresyl phosphate, cresyldiphenyl phosphate, octyldiphenyl phosphate, diphenyl biphenyl phosphate, trioctyl phosphate, tributyl phosphate and the like.

The phosphate-based compound can be added together with the above-mentioned fluorine-based compound at a weight ratio of 1:5 to 5:1. The phosphate-based compound can have a refractive index of less than 1.5 and a molecular weight of 700 or less.

The photopolymer composition can further include other additives, a catalyst, and the like. For example, the photopolymer composition can include a commonly known catalyst for promoting polymerization of the polymer matrix or photoreactive monomer. Examples of the catalyst include tin octanoate, zinc octanoate, dibutyltin dilaurate, dimethylbis[(1-oxoneodecyl)oxy]stannane, dimethyl tin dicarboxylate, zirconium bis(ethylhexanoate), zirconium acetylacetonate, p-toluenesulfonic acid or tertiary amines, for example, 1,4-diazabicyclo[2.2.2]octane, diazabicyclononane, diazabicyclo dodecane, 1,1,3,3-tetramethylguanidine, 1,3,4,6,7,8-hexahydro-1-methyl-2H-pyrimido(1,2-a)pyrimidine, and the like.

Examples of the other additives include a defoaming agent, and as the defoaming agent, a silicone-based reactive additive can be used, and an example thereof is Tego Rad 2500.

Meanwhile, the photopolymer composition of the embodiment can, in addition to the compound of Chemical Formula 1, further include a photoreactive dye different therefrom.

The photosensitizing dye serves as photosensitizing pigment to sensitize the photoinitiator. More specifically, the photosensitizing dye can be stimulated by the light irradiated on the photopolymer composition and can also serve as an initiator to initiate polymerization of the monomer and the crosslinking monomer, Examples of the photosensitizing dyes different from the compound of Chemical Formula 1 are not particularly limited, and various compounds commonly known in the art can be used. Specific examples of the photosensitizing dye include sulfonium derivative of ceramidonine, new methylene blue, thioerythrosine triethylammonium, 6-acetylamino-2-methylceramidonin, eosin, erythrosine, rose bengal, thionine, basic yellow, Pinacyanol chloride, Rhodamine 6G, Gallocyanine, ethyl violet, Victoria blue R, Celestine blue, Quinaldine Red, Crystal Violet, Brilliant Green, Astrazon orange G, Darrow Red, Pyronin Y, Basic Red 29, pyrylium iodide, Safranin O, Cyanine, Methylene Blue, Azure A, or a combination of two or more thereof.

Meanwhile, an organic solvent can be used in the production of the photopolymer composition of the embodiment. Non-limiting examples of the organic solvent include ketones, alcohols, acetates, ethers, and mixtures of two or more thereof.

Specific examples of such organic solvent include ketones such as methyl ethyl ketone, methyl isobutyl ketone, acetylacetone or isobutyl ketone; alcohols such as methanol, ethanol, n-propanol, i-propanol, n-butanol, i-butanol or t-butanol; acetates such as ethyl acetate, i-propyl acetate, or polyethylene glycol monomethyl ether acetate; ethers such as tetrahydrofuran or propylene glycol monomethyl ether; or a mixture of two or more thereof.

The organic solvent can be added at the time of mixing the respective components contained in the photopolymer composition for producing the hologram recording medium, or can be contained in the photopolymer composition while adding the respective components in a state of being dispersed or mixed in an organic solvent. When the content of the organic solvent in the photopolymer composition is too low, the fluidity of the photopolymer composition can be lowered, resulting in the occurrence of defects such as the occurrence of striped patterns on the finally produced film. In addition, when the organic solvent is added in an excess amount, the solid content is lowered, and the coating and film formation are not sufficient, so that the physical properties and surface characteristics of the film can be deteriorated and defects can occur during the drying and curing process. Thus, the photopolymer composition can include an organic solvent such that the total solid content concentration of the components contained is 1% to 70% by weight, or 2% to 50% by weight.

Meanwhile, according to another embodiment of the present disclosure, a hologram recording medium produced from the photopolymer composition of the embodiment can be provided.

The details concerning the photopolymer composition of the embodiment are the same as those described above.

Meanwhile, the hologram recording medium can achieve a refractive index modulation value (n) of 0.020 or more, 0.021 or more, or 0.023 or more, or 0.025 or more, or 0.027 or more, or any one of the lower limits to 0.035 even at a thickness of 5 μm to 30 μm.

In addition, the hologram recording medium can achieve 50% or more, 85% or more, or 85 to 99% of diffraction efficiency at a thickness of 5 μm to 30 μm.

In the photopolymer composition for producing the hologram recording medium, the respective components contained therein are homogeneously mixed, dried and cured at a temperature of 20° C. or higher, and then subjected to predetermined exposure procedures, thereby producing a hologram for optical application in the entire visible range and the near ultraviolet region (300 to 800 nm).

In the photopolymer composition, the components forming a polymer matrix or the precursor thereof are first homogeneously mixed, and the above-described silane crosslinking agent is subsequently mixed with the catalyst, thereby preparing the process of forming holograms.

In the photopolymer composition, for mixing the respective components contained therein, a mixing device, a stirrer, a mixer, or the like which are commonly known in the art can be used without particular limitation. The temperature in the mixing process can be 0° C. to 100° C., preferably 10° C. to 80° C., particularly preferably 20° C. to 60° C.

Meanwhile, the components forming a polymer matrix or the precursor thereof in the photopolymer composition are first homogenized and mixed, and then it can be a liquid formulation that is cured at a temperature of 20° C. or more. The curing temperature can vary depending on the composition of the photopolymer and the curing is promoted, for example, by heating at a temperature of from 30° C. to 180° C.

At the time of curing, the photopolymer can be in state of being injected into or coated onto a predetermined substrate or mold.

Meanwhile, as the method of recording a visual hologram on a hologram recording medium produced from the photopolymer composition, generally known methods can be used without particular limitation, and the method described in the holographic recording method of the embodiment described hereinafter can be adopted as one example.

Meanwhile, according to another embodiment of the present disclosure, there can be provided a hologram recording medium comprising: a polymer matrix or a precursor thereof; a dye including a compound of the following Chemical Formula 1; and a photoreactive monomer, wherein the hologram recording medium has a refractive index modulation value (n) of 0.023 or more in a thickness range of 5 μm to 30 μm:

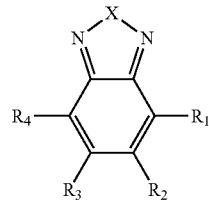

[Chemical Formula 1]

wherein in Chemical Formula 1:
X is oxygen or sulfur; and
$R_1$ to $R_4$ are each independently selected from the group consisting of:
hydrogen;
an alkyl group having 1 to 20 carbon atoms;
an alkoxy group having 1 to 20 carbon atoms;
a cycloalkyl group having 4 to 20 carbon atoms;
an aromatic hydrocarbon group having 6 to 20 carbon atoms;
an aromatic hydrocarbon group having 6 to 20 carbon atoms to which a cyanoacrylate or an ester group thereof is bonded;
an amine group;
a halogen;
an alicyclic or aromatic heterocycle having 4 to 20 carbon atoms containing at least one of oxygen, sulfur or nitrogen;
a cycloalkyl group having 4 to 20 carbon atoms substituted with at least one alicyclic or aromatic heterocycle having 4 to 20 carbon atoms containing at least one of oxygen, sulfur or nitrogen; and
an aromatic hydrocarbon group having 6 to 20 carbon atoms substituted with at least one alicyclic or aromatic heterocycle having 4 to 20 carbon atoms containing at least one of oxygen, sulfur or nitrogen.

The details concerning each of the polymer matrix or a precursor thereof, a dye including a compound of Chemical Formula 1, and a photoreactive monomer include all the contents described above with respect to the photopolymer composition of the embodiment.

The hologram recording medium can achieve a refractive index modulation value (n) of 0.023 or more, or 0.025 or more, or 0.027 or more, or any one of the lower limits to 0.035 even at a thickness of 5 μm to 30 μm.

Further, the hologram recording medium can achieve a diffraction efficiency of 50% or more, or 85% or more, or 85 to 99% at a thickness of 5 μm to 30 μm.

Meanwhile, the coating layer can further include a low refractive index fluorine-based compound comprising at least two difluoromethylene groups and at least one functional group selected from the group consisting of an ether group, an ester group and an amide group.

Meanwhile, as described above, when the compound of Chemical Formula 1 and the low refractive-index fluorine-based compound are used together, Tg of the matrix is lowered by the low refractive index fluorine-based compound serving as a plasticizer, and the reduction reaction rate of the compound dye of Chemical Formula in the flexible matrix is accelerated, or the hydrogen transfer speed or the like as an initiator (H-Transfer) can be accelerated, whereby the monomer polymerization rate due to radical generation is improved, and the effect of increasing the recording efficiency or reducing the recording time can be achieved.

Meanwhile, the hologram recording medium can be formed by coating and drying the photopolymer composition, or it can also be formed by coating and thermally curing or photocuring the photopolymer composition.

The hologram recording medium can further include a substrate on which the coating layer is formed on one side. The substrate can be any one of various types of substrates such as polymer films and glass substrates.

Meanwhile, according to another embodiment of the present disclosure, there can be provided a holographic recording method which comprises selectively polymerizing photoreactive monomers contained in the photopolymer composition by a coherent laser.

As described above, through the process of mixing and curing the photopolymer composition, it is possible to produce a medium in a form in which no visual hologram is recorded, and a visual hologram can be recorded on the medium through a predetermined exposure process.

A visual hologram can be recorded on the media provided through the process of mixing and curing the photopolymer composition, using known devices and methods under commonly known conditions.

Meanwhile, according to another embodiment of the present disclosure, an optical element including a hologram recording medium can be provided.

Specific examples of the optical element include optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

An example of an optical element including the hologram recording medium can include a hologram display device.

The hologram display device includes a light source unit, an input unit, an optical system, and a display unit. The light source unit is a portion that irradiates a laser beam used for providing, recording, and reproducing three-dimensional image information of an object in the input unit and the display unit. Further, the input unit is a portion that previously inputs three-dimensional image information of an object to be recorded on the display unit, and for example, three-dimensional information of an object such as the intensity and phase of light for each space can be inputted into an electrically addressed liquid crystal SLM, wherein an input beam can be used. The optical system can include a mirror, a polarizer, a beam splitter, a beam shutter, a lens, and the like. The optical system can be distributed into an input beam for sending a laser beam emitted from the light source unit to the input unit, a recording beam for sending the laser beam to the display unit, a reference beam, an erasing beam, a reading beam, and the like.

The display unit can receive three-dimensional image information of an object from an input unit, record it on a hologram plate comprising an optically addressed SLM, and reproduce the three-dimensional image of the object. In this case, the three-dimensional image information of the object can be recorded via interference of the input beam and the reference beam. The three-dimensional image information of the object recorded on the hologram plate can be reproduced into a three-dimensional image by the diffraction pattern generated by the reading beam. The erasing beam can be used to quickly remove the formed diffraction pattern. Meanwhile, the hologram plate can be moved between a position at which a three-dimensional image is inputted and a position at which a three-dimensional image is reproduced.

Advantageous Effects

According to the present disclosure, there can be provided a compound having a novel structure, a photopolymer composition capable of providing a hologram recording medium which can achieve a large refractive index modulation value even while being thin, has a relatively fast reaction rate and thus can shorten the recording time, and has improved durability against temperature and humidity, a hologram recording medium which can achieve a large refractive index modulation value even while being thin, has a relatively fast reaction rate and thus can shorten the recording time, and has improved durability against temperature and humidity, an optical element including the hologram recording medium, and a holographic recording method using the hologram recording medium.

DETAILED DESCRIPTION OF THE EMBODIMENTS

Hereinafter, the present disclosure will be described in more detail by way of the following examples. However, these examples are given for illustrative purposes only and are not intended to limit the scope of the present disclosure thereto.

Preparation Example

1. Preparation Example 1-1: Synthesis of Dye Compound (5,6-dimethoxy-4,7-di(thiophen-3-yl)-benzo[c]-1,2,5-thiadiazole)

(1) Preparation of 1,2-dimethoxybenzene (Compound 2)

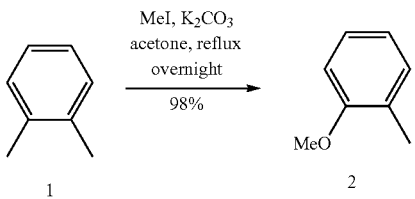

A mixture of catechol (10 g, 0.0908 mol) and $K_2CO_3$ (31.3 g, 0.2270 mol) was stirred under nitrogen for 10 minutes. Iodomethane (11.8 mL, 0.1906 mol) was added thereto, and the mixture was stirred at room temperature for 1.5 hours, and then heated under reflux overnight. The reaction was cooled to room temperature, $K_2CO_3$ was filtered off, and the filtrate was concentrated. The residue was dissolved in dichloromethane, and the solution was washed with water. The organic layer was separated, dried over $MgSO_4$ and concentrated to give 12.3 g (98%) of Compound 2.

1H NMR ($CDCl_3$): 6.94-6.87 (4H, s, Ar), 3.90 (6H, s, $2CH_3$).

(2) Preparation of 1,2-dimethoxy-4,5-dinitrobenzene (Compound 3)

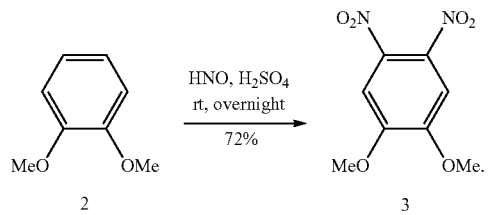 [SMILES: COc1ccccc1OC ; COc1cc([N+](=O)[O-])c([N+](=O)[O-])cc1OC]

10.5 g of 1,2-Dimethoxybenzene (Chemical Formula 2) was dissolved in 420 mL of dichloromethane, and then the solution was added dropwise to 69% $HNO_3$ (169 mL) in an ice bath over 30 minutes. Concentrated $H_2SO_4$ (83 mL) was added dropwise to this mixture and stirring was continued overnight at room temperature. The reaction mixture was poured onto crushed ice, and the resulting suspension was extracted with dichloromethane. The organic layer was separated, washed with 1N NaOH brine, and dried over $MgSO_4$. The solvent was evaporated to give the product, which was recrystallized from ethanol (200 nm).

Yield: 12.6 g (72%).

1H NMR ($CDCl_3$): 7.35 (2H, s, Ar), 4.03 (6H, s, $2CH_3$).

(3) Preparation of 4,5-dimethoxybenzene-1,2-diamine (Chemical Formula 4)

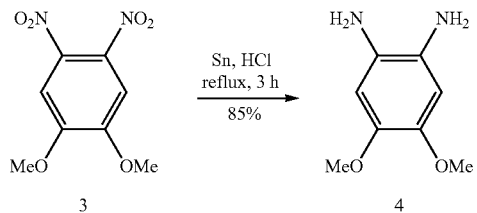 [SMILES: COc1cc([N+](=O)[O-])c([N+](=O)[O-])cc1OC ; COc1cc(N)c(N)cc1OC]

1,2-Dimethoxy-4,5-dinitrobenzene (Compound 3) (4.6 g, 0.0202 mol) and tin (11.9 g, 0.1010 mol) were dissolved in 100 mL of HCl, and the solution was heated to reflux for 3 hours. The reaction was cooled, and 90 mL of NaOH solution in 90 nit water) was carefully added thereto. The product was extracted with dichloromethane, and the organic layer was separated, washed with water, dried over $MgSO_4$ and concentrated.

Yield: 2.9 g (85%).

1H NMR ($CDCl_3$): 6.37 (2H, s, Ar), 3.79 (6H, s, $2CH_3$), 3.16 (4H, s, $2NH_2$).

(4) Preparation of 5,6-dimethoxybenzo[c]-1,2,5-thiadiazole (Compound 5)

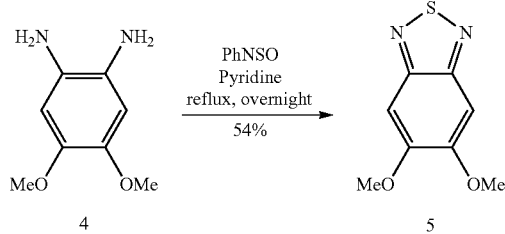 [SMILES: COc1cc(N)c(N)cc1OC ; COc1cc2nsnc2cc1OC]

A mixture of 4,5-Dimethoxybenzene-1,2-diamine (Compound 4) (2.7 g, 0.0160 mol), N-thionylaniline (3.6 mL, 0.0321 mol) and 20 mL of pyridine were refluxed overnight. The reaction was cooled and quenched with cold 3N HCl (100 mL). The dark suspension was filtered and the filtrate was extracted with dichloromethane and ethyl acetate. The organic phase was dried over $MgSO_4$. After removing the solvent, the residue was purified by a column (eluent: dichloromethane).

Yield: 2.1 g (67.7%).

1H NMR ($CDCl_3$): 7.19 (2H, s, Ar), 4.02 (6H, s, $2CH_3$).

(5) Preparation of 4,7-dibromo-5,6-dimethoxybenzo[c]-1,2,5-thiadiazole (Compound 6)

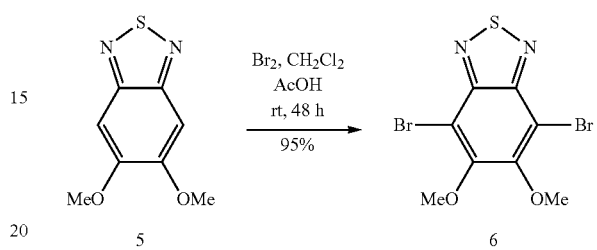

5,6-Dimethoxybenzo[c]-1,2,5-thiadiazole (Compound 5) (0.5 g, 0.0025 mol) was dissolved in a mixture of dichloromethane (60 mL) and AcOH (30 mL), and bromine (0.4 ml, 0.018 mol) was added, and stirred in the dark at room temperature for 48 hours. The mixture was poured into water (150 mL), and the product was extracted with dichloromethane. The organic layer was separated, washed with saturated aqueous $NaHCO_3$, then washed with saturated aqueous $Na_2S_2O_3$, and dried over $MgSO_4$. After removing the solvent, the residue was purified by column (eluent: hexane).

Yield: 0.8 g (95%).

1H NMR ($CDCl_3$): 4.05 (6H, s, $2CH_3$). 13C NMR ($CDCl_3$): 155.03, 150.51, 106.36, 61.85

(6) Preparation of 4,7-dibromo-5,6-dimethoxybenzo[c]-1,2,5-thiadiazole (Compound 6)

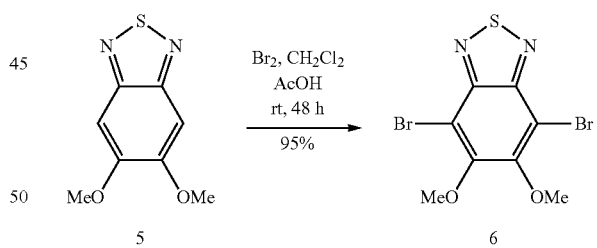

5,6-Dimethoxybenzo[c]-1,2,5-thiadiazole (Compound 5) (0.5 g, 0.0025 mol) was dissolved in a mixture of dichloromethane (60 mL) and AcOH (30 mL), and bromine (0.4 ml, 0.018 mol) was added, and stirred in the dark at room temperature for 48 hours. The mixture was poured into water (150 mL), and the product was extracted with dichloromethane. The organic layer was separated, washed with saturated aqueous $NaHCO_3$, then washed with saturated aqueous $Na_2S_2O_3$, and dried over $MgSO_4$. After removing the solvent, the residue was purified by column (eluent: hexane).

Yield: 0.8 g (95%).

1H NMR ($CDCl_3$): 4.05 (6H, s, $2CH_3$). 13C NMR ($CDCl_3$): 155.03, 150.51, 106.36, 61.85

(7) Preparation of 5,6-dimethoxy-4,7-di(thiophen-3-yl)-benzo[c]-1,2,5-thiadiazole (Dye of Chemical Formula 7)

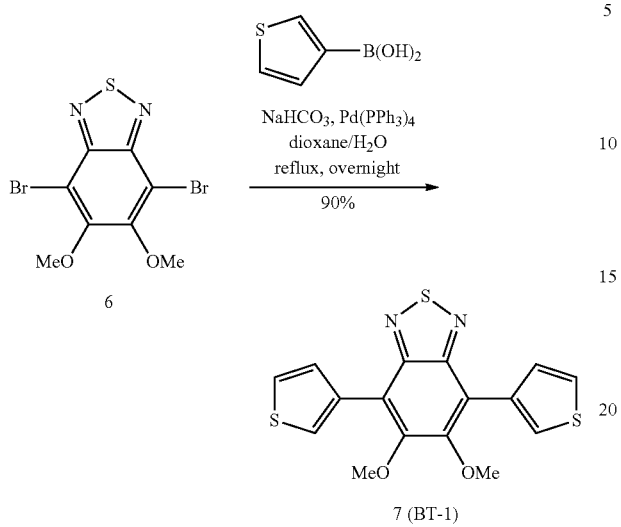

A mixture of Compound 6 (0.5 g, 0.0015 mol), 1M NaHCO₃ (15 mL), dioxane (15 mL) and 3-thiophenboronic acid (0.5 g, 0.0039 mol) was heated under reflux. Pd(PPh₃)₄ (0.034 g, 0.00003 mol) was added thereto, and the reaction was refluxed under nitrogen overnight. The reaction was cooled at room temperature, and the residue was filtered and then dissolved in dichloromethane. The solution was washed with water, the organic phase was separated, then dried over MgSO₄ and concentrated. The residue was dissolved in methanol and filtered.

Yield: 0.5 g (90%).

1H NMR (CDCl₃): 8.13-8.12 (2H, d, Ar), 7.85-7.83 (2H, d, Ar), 7.49-7.47 (2H, m, Ar), 3.87 (6H, s, 2CH₃).

UV-VIS spectrum: λmax=410 nm

*UV-VIS spectrum

The synthesized dye was diluted to 0.001 wt % with methyl ethyl ketone (MEK) solvent using a UV-Vis Spectrophotometer, and the absorbance (%) in the wavelength range of 380 nm to 780 nm was measured to determine the maximum absorption wavelength.

2. Preparation Example 1-2: Synthesis of Dye Compound (7-(2,4-di(piperidin-1-yl)phenyl)benzo[c][1,2,5]oxadiazol-4-amine)

(1) Preparation of 1,3-di(piperidin-1-yl)benzene (Chemical Formula 9)

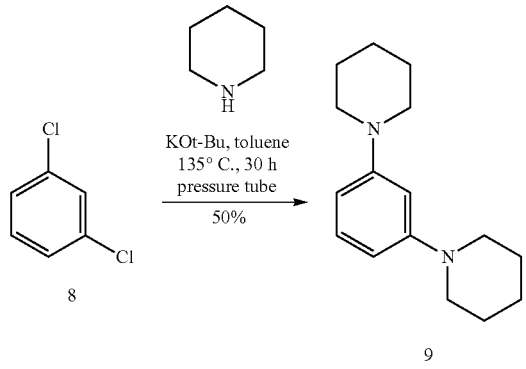 [SMILES: Clc1cccc(Cl)c1 ; C1CCNCC1 ; c1cc(N2CCCCC2)cc(N2CCCCC2)c1]

1,3-Dichlorobenzene (0.7 mL, 0.0068 mol) and piperidine (2 mL, 0.0204 mol) were dissolved in 30 mL of toluene in a pressure tube. KOt-Bu (3 g, 0.027:2 mol) was added and the pressure tube was sealed and then heated at 135° C. for 30 hours. The reaction was cooled to room temperature and 30 mL of water was added. The aqueous phase was separated, and extracted with dichloromethane. The organic phase was dried over MgSO₄ and concentrated. The residue was purified by column (eluent:hexane:EA 95:5):

Yield: 0.8 g (50%).

1H NMR (CDCl₃): 7.15-7.09 (1H, t, Ar), 6.55-7.53 (1H, m, Ar), 6.48-6.44 (2H, d, Ar), 3.14-3.11 (8H, m, 4CH₂) 1.74-1.67 (8H, m, 4CH₂), 1.59-1.53 (4H, m, 2CH₂).

(2) Preparation of 4-(2,4-di(piperidin-1-yl)phenyl)-7-nitrobenzo[c][1,2,5]-oxadiazole (Compound 10)

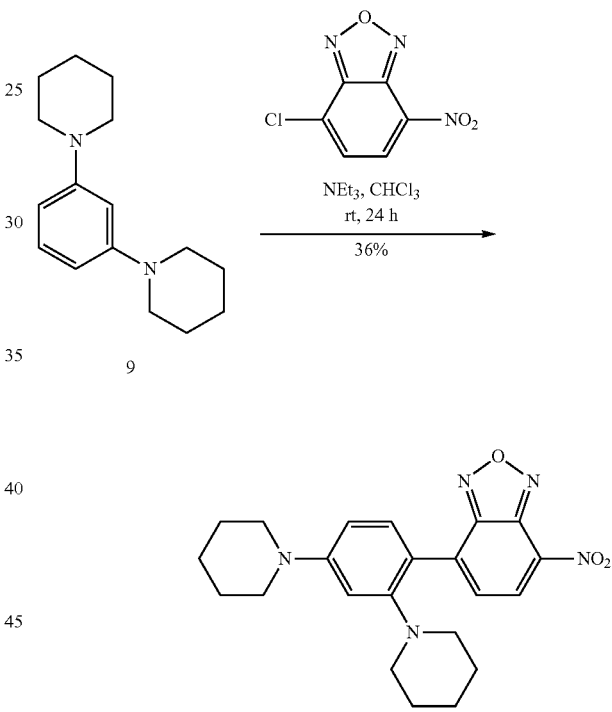

4-Chloro-7-nitrobenzofurazan (0.57 g, 0.0028 mol) was dissolved in 40 mL of chloroform. Triethylamine (4 mL, 0.0028 mol) and Compound 8 (0.7 g, 0.0028 mol) were added to the solution. The color of the solution changed from pale yellow to dark blue. The reaction solution was stirred at room temperature for 24 hours. Water was added and the organic phase was separated, dried over MgSO₄ and concentrated. The residue was purified by column (eluent: hexane:EA 9:1).

Yield: 0.4 g (36%).

1H NMR (CDCl₃): 8.53-8.51 (1H, d, Ar), 8.30-8.27 (1H, d, Ar), 7.68-7.65 (1H, d, Ar), 6.67-6.62 (2H, m, Ar) 3.36-3.33 (4H, m, 2CH₂), 2.86-2.82 (4H, m, 2CH₂), 1.75-1.64 (6H, m, 3CH₂), 1.49-1.45 (6H, m, 3CH₂).

(3) Preparation of 7-(2,4-di(piperidin-1-yl)phenyl) benzo[c][1,2,5]oxadiazol-4-amine (Dye of Chemical Formula 11)

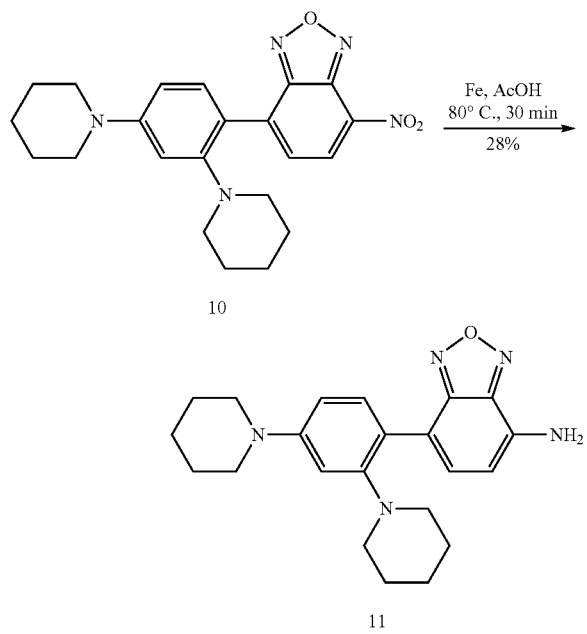

4-(2,4-Di(piperidin-1-yl)phenyl)-7-nitrobenzo[c][1,2,5]-oxadiazole (Compound 10) (0.4 g, 0.00098 mol) was dissolved in AcOH (10 mL). The solution was heated to 80° C., and iron powder (0.16 g, 0.00294 mol) was added under nitrogen. The mixture was stirred at 80° C. for 30 minutes. The reaction solution was cooled to room temperature and concentrated in vacuo. The residue was dissolved in ethyl acetate and washed with saturated aqueous $NaHCO_3$. The aqueous layers were combined and washed with ethyl acetate. The organic layers were combined, dried over $MgSO_4$ and concentrated. The residue was purified by column (eluent:hexane:EA 9:1-7:3). The product was dissolved in dichloromethane, precipitated by adding hexane, and then filtered.

Yield: 0.1 g (28%).

1H NMR ($CDCl_3$): 7.63-7.60 (1H, d, Ar), 7.39-7.37 (1H, d, Ar), 6.67-6.62 (2H, m, Ar), 6.45-6.42 (1H, d, Ar) 4.49 (2H, s, $NH_2$), 3.22-3.18 (4H, t, $2CH_2$), 2.80-2.78 (4H, m, $2CH_2$), 1.76-1.69 (4H, m, $2CH_2$), 1.63-1.57 (2H, m, $CH_2$), 1.38-1.35 (6H, m, $3CH_2$).

UV-VIS spectrum: λmax=454 nm

*UV-VIS spectrum

The synthesized dye was diluted to 0.001 wt % with methyl ethyl ketone (MEK) solvent using a UV-Vis Spectrophotometer, and the absorbance (%) in the wavelength range of 380 nm to 780 nm was measured to determine the maximum absorption wavelength.

Preparation Example 2: Preparation of Non-Reactive Low Refractive Index Material (P-1)

20.51 g of 2,2'-((oxybis(1,1,2,2-tetrafluoroethane-2,1-diyl))bis(oxy))bis(2,2-difluoroethan-1-ol) was placed in a 1000 ml flask, and then dissolved in 500 g of tetrahydrofuran and 4.40 g of sodium hydride (60% dispersion in mineral oil) was carefully added several times while stirring at 0° C. for 20 minutes, 12.50 ml of 2-methoxyethoxymethyl chloride was slowly dropped. When it was confirmed that all of the reactants have been consumed by $^1$H NMR, the reaction solvent was removed under reduced pressure. After extraction was performed three times with 300 g of dichloromethane, the organic layer was collected, and filtered with magnesium sulfate, applied to reduced pressure to remove all dichloromethane. Thereby, 29 g of a liquid product having a purity of 95% or more was obtained at a yield of 98%.

Preparation Example 3: Preparation of (Meth)Acrylate-Based (Co)Polymer in Which Silane Functional-Based Group is Located in a Branched Chain 69.3 g of butyl acrylate and 20.7 g of KBM-503 (3-methacryloxypropyltrimethoxysilane) were placed in a 2 L jacket reactor, and diluted with 700 g of ethyl acetate. The reaction temperature was set at about 70° C. and stirring was performed for about one hour. 0.02 g of n-dodecyl mercaptan was further added and stirring was performed for about 30 minutes. Then, 0.06 g of AIBN, which is a polymerization initiator, was added and polymerization was allowed to proceed for 4 hours or more at the reaction temperature and maintained until the content of the residual acrylate became less than 1%, thereby preparing (meth)acrylate-based (co)polymer (weight average molecular weight: about 900,000, $Si-(OR)_3$ equivalent weight: 1019 g/equivalent) in which a silane-based functional group is located in a branched chain.

Preparation Example 4: Preparation of Silane Crosslinking Agent 19.79 g of KBE-9007 (3-isocyanatopropyltriethoxysilane), 12.80 g of PEG-400 and 0.57 g of DBTDL were placed in a 1000 ml flask, and diluted with 300 g of tetrahydrofuran. Stirring was performed at room temperature until being confirmed by TLC that all the reaction material had been consumed, the reaction solvent was all removed under reduced pressure.

28 g of a liquid product having a purity of 95% or more was separated at a yield of 91% through column chromatography under a developing solution of dichloromethane: methyl alcohol=30:1 to obtain a silane crosslinking agent.

Examples and Comparative Examples: Preparation of Photopolymer Composition

As shown in Table 1 below, the (meth)acrylate-based (co)polymer of Preparation Example 3 in which the silane-based functional group is located in a branched chain, a photoreactive monomer (high refractive index acrylate, refractive index of 1.600, HR6022 [Miwon Specialty Chemical]), the non-reactive low refractive index material of Preparation Example 2, tributyl phosphate [TBP], 3,3'-carbonyl bis(7-diethylaminocoumarin) [Aldrich product], Compounds of Preparation Examples 1-1 and 1-2, Ebecryl P-115 (SK Entis), Borate V (Spectra Group), Irgacure 250 (Onium salt, BASF) and methyl isobutyl ketone (MIBK) were mixed in a state where light was blocked, and stirred for about 10 minutes with a Paste mixer to obtain a clear coating solution.

The silane crosslinking agent of Preparation Example 4 was added to the coating solution and further stirred for 5 to 10 minutes. Then, DBTDL as a catalyst was added to the coating solution, stirred for about 1 minute, then coated to a thickness of 7 μm on a TAC substrate having a thickness of 80 μm using a Meyer bar and dried at 40° C. for 1 hour.

Experimental Example: Holographic Recording (1) The photopolymer-coated surfaces prepared in each of Examples and Comparative Examples were laminated on a slide glass, and fixed so that a laser first passed through the glass surface at the time of recording.

(2) Measurement of Diffraction Efficiency (η)

A holographic recording was done via interference of two interference lights (reference light and object light), and the transmission-type recording was done so that the two beams were incident on the same side of the sample. The diffraction efficiencies are changed according to the incident angle of the two beams, and become non-slanted when the incident angles of the two beams are the same. In the non-slanted recording, the diffraction grating is generated vertically to the film because the incident angles of the two beams are the same on the normal basis.

The recording)(2θ=45°) was done in a transmission-type non-slanted manner using a laser with a wavelength of 460 nm or a laser with a wavelength of 473 nm, and the diffraction efficiency (η) was calculated according to the following Equation 1.

$$\eta = \frac{P_D}{P_D + P_T} \quad \text{[Equation 1]}$$

In the Equation 1, η is a diffraction efficiency, $P_D$ is an output amount (mW/cm$^2$) of the diffracted beam of a sample after recording, and $P_T$ is an output amount (mW/cm$^2$) of the transmitted beam of the recorded sample.

(3) Measurement of the refractive index modulation value (n)

The lossless dielectric grating of the transmission-type hologram can calculate the refractive index modulation value (Δn) from the following Equation 2.

$$\eta(DE) = \sin^2\left(\sqrt{v^2}\right) = \sin^2\left(\frac{\pi \Delta n d}{\lambda \cos\theta}\right) \quad \text{[Equation 2]}$$

in Equation 2, d is a thickness of the photopolymer layer, (Δn) is a refractive index modulation value, (η)DE) is a diffraction efficiency, and λ is a recording wavelength.

TABLE 1

Measurement Results of Experimental Examples of Photopolymer Compositions of Examples (unit: g) and Holographic Recording Medium Prepared Therefrom

| Category | | Example 1 | Example 2 | Example 3 | Example 4 | Comparative Example 1 | Comparative Example 2 |
|---|---|---|---|---|---|---|---|
| (Meth)acrylate-based copolymer | Preparation Example 3 | 21.5 | 21.5 | 21.5 | 21.5 | 21.5 | 21.5 |
| Linear silane crosslinking agent | Preparation Example 4 | 6.1 | 6.1 | 6.1 | 6.1 | 6.1 | 6.1 |
| Photoreactive monomer | HR6022 | 40.2 | 40.2 | 40.2 | 40.2 | 40.2 | 40.2 |
| Dye | 3,3'-Carbonyl bis (7-diethylaminocoumarin) | | | | | 0.3 | 0.3 |
| | Preparation Example 1-1 | 0.3 | 0.3 | | | | |
| | Preparation Example 1-2 | | | 0.3 | 0.3 | | |
| Initiator | Amine (Ebecryl P-115) | 1.5 | | 1.5 | | | |
| | Borate salt (Borate V) | | 0.2 | | 0.2 | | 0.2 |
| | Onium salt (Irgacure 250) | 0.1 | 0.1 | 0.1 | 0.1 | 0.1 | 0.1 |
| Non-reactive low refractive index material | Preparation Example 2 | 30 | 30 | 30 | 30 | 30 | 30 |
| Catalyst | DBTDL(dibutyltin dilaurate) | 0.02 | 0.02 | 0.02 | 0.02 | 0.02 | 0.02 |
| Additive | BYK3500 | 0.5 | 0.5 | 0.5 | 0.5 | 0.5 | 0.5 |
| Solvent | MIBK | 295 | 295 | 295 | 296 | 300 | 300 |
| Coating thickness (unit: μm) | | 8 | 8 | 8 | 8 | 8 | 8 |
| Recording time (sec) | | 10 | 10 | 10 | 30 | 30 | 45 |
| Δn | | 0.028 | 0.027 | 0.025 | 0.030 | 0.020 | 0.022 |

As shown in Table 1 above, it was confirmed that the hologram recording medium of Examples 1 to 4 can achieve a refractive index modulation value (Δn) of 0.025 or more at a thickness of 8 μm. In contrast, it was confirmed that the hologram recording medium of Comparative Examples 1 to 3 has a relatively low diffraction efficiency as compared with Examples.

That is, as the result of the evaluation after hologram recording (460 nm Laser) for Examples 1 to 4, it was confirmed that when the compounds obtained in the Preparation Examples 1-1 and 1-2 were used, a relatively high level of refractive index modulation value (Δn) was achieved, and it had a relatively fast reaction rate and could shorten the recording time, as compared with the dye used in the Comparative Examples.

The invention claimed is:

1. A photopolymer composition for hologram recording comprising:
   a polymer matrix or a precursor thereof;
   a dye including a compound of the following Chemical Formula 1;

a photoreactive monomer; and
a photoinitiator,

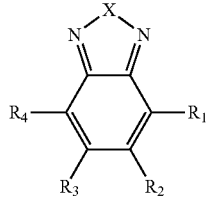

[Chemical Formula 1]

wherein in Chemical Formula 1:
X is oxygen or sulfur; and
$R_2$ and $R_3$ are each independently an alkoxy group having 1 to 5 carbon atoms; and $R_1$ and $R_4$ are each independently selected from the group consisting of: an alicyclic or aromatic heterocycle having 4 to 20 carbon atoms containing at least one of oxygen, sulfur or nitrogen; a cycloalkyl group having 4 to 20 carbon atoms substituted with an alicyclic or aromatic heterocycle having 4 to 20 carbon atoms containing one or more of oxygen, sulfur or nitrogen; and an aromatic hydrocarbon group having 6 to 20 carbon atoms substituted with an alicyclic or aromatic heterocycle having 4 to 20 carbon atoms containing one or more of oxygen, sulfur or nitrogen; or
$R_2$ and $R_3$ are each independently hydrogen, an alkyl group having 1 to 20 carbon atoms, or a halogen; and one of $R_1$ and $R_4$ is an amine group and the other is selected from the group consisting of: an alicyclic or aromatic heterocycle having 4 to 20 carbon atoms containing at least one of oxygen, sulfur or nitrogen; a cycloalkyl group having 4 to 20 carbon atoms; and an aromatic hydrocarbon group having 6 to 20 carbon atoms substituted with an alicyclic or aromatic heterocycle having 4 to 20 carbon atoms containing at least one of oxygen, sulfur or nitrogen.

2. The photopolymer composition according to claim 1, wherein the polymer matrix or a precursor thereof includes:
1) a reaction product between a compound containing one or more isocyanate groups and a polyol; or
2) a polymer matrix including a silane crosslinking agent and a (meth)acrylate-based (co)polymer in which a silane-based functional group is located in a branched chain.

3. The photopolymer composition according to claim 2, wherein the silane crosslinking agent includes:
a linear polyether main chain having a weight average molecular weight of 100 to 2000; and
a silane-based functional group bonded at a terminal end or a branched chain of the main chain.

4. The photopolymer composition according to claim 2, wherein:
the (meth)acrylate-based (co)polymer includes a (meth) acrylate repeating unit and a (meth)acrylate repeating unit in which a silane-based functional group is located in the branched chain; and
the (meth)acrylate-based (co)polymer has a weight average molecular weight of 100,000 to 1,000,000.

5. The photopolymer composition according to claim 1, wherein the photoreactive monomer includes a polyfunctional (meth)acrylate monomer or a monofunctional (meth)acrylate monomer.

6. The photopolymer composition according to claim 1, comprising:
1% to 80% by weight of the polymer matrix or a precursor thereof;
1% to 80% by weight of the photoreactive monomer;
0.0001% to 10% by weight of the dye; and
0.1% to 20% by weight of the photoinitiator.

7. The photopolymer composition according to claim 1, wherein the photopolymer composition further comprises at least one additive selected from the group consisting of a catalyst, a phosphate-based compound, and a low refractive index fluorine-based compound.

8. The photopolymer composition according to claim 7, wherein the low refractive index fluorine-based compound includes at least two difluoromethylene groups and at least one functional group selected from the group consisting of an ether group, an ester group and an amide group.

9. A hologram recording medium, comprising the photopolymer composition of claim 1.

10. An optical element comprising:
a recorded holographic media of the hologram recording medium of claim 9,
wherein the recorded holographic media includes a holographic pattern corresponding to the optical element.

11. A holographic recording method comprising selectively polymerizing photoreactive monomers contained in the photopolymer composition of claim 1 by interference of two interference lights.

12. A hologram recording medium, comprising:
a polymer matrix or a precursor thereof;
a dye including a compound of the following Chemical Formula 1; and
a photoreactive monomer,
wherein the hologram recording medium has a refractive index modulation value (n) of 0.023 or more in a thickness range of 5 μm to 30 μm:

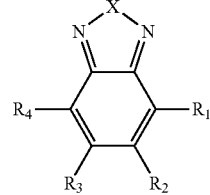

[Chemical Formula 1]

wherein in Chemical Formula 1:
X is oxygen or sulfur; and
$R_2$ and $R_3$ are each independently an alkoxy group having 1 to 5 carbon atoms; and $R_1$ and $R_4$ are each independently selected from the group consisting of: an alicyclic or aromatic heterocycle having 4 to 20 carbon atoms containing at least one of oxygen, sulfur or nitrogen; a cycloalkyl group having 4 to 20 carbon atoms substituted with an alicyclic or aromatic heterocycle having 4 to 20 carbon atoms containing one or more of oxygen, sulfur or nitrogen; and an aromatic hydrocarbon group having 6 to 20 carbon atoms substituted with an alicyclic or aromatic heterocycle having 4 to 20 carbon atoms containing one or more of oxygen, sulfur or nitrogen; or
$R_2$ and $R_3$ are each independently hydrogen, an alkyl group having 1 to 20 carbon atoms, or a halogen; and one of $R_1$ and $R_4$ is an amine group and the other is selected from the group consisting of: an alicyclic or aromatic heterocycle having 4 to 20 carbon atoms containing at least one of oxygen, sulfur or nitrogen; a cycloalkyl group having 4 to 20 carbon atoms; and an aromatic hydrocarbon group having 6 to 20 carbon atoms substituted with an alicyclic or aromatic heterocycle having 4 to 20 carbon atoms containing at least one of oxygen, sulfur or nitrogen.

13. The hologram recording medium according to claim 12, wherein the coating layer further includes a low refractive index fluorine-based compound comprising at least two difluoromethylene groups and at least one functional group selected from the group consisting of an ether group, an ester group and an amide group.

14. An optical element comprising:
a recorded holographic media of the hologram recording medium of claim 12,
wherein the recorded holographic media includes a holographic pattern corresponding to the optical element.

* * * * *